United States Patent [19]

Yanagibori

[11] 4,063,177
[45] Dec. 13, 1977

[54] PLURAL BAND, SINGLE/DOUBLE CONVERSION RADIO RECEIVER

[75] Inventor: Masami Yanagibori, Tokyo, Japan

[73] Assignee: Sony Corporation, Tokyo, Japan

[21] Appl. No.: 729,680

[22] Filed: Oct. 5, 1976

[30] Foreign Application Priority Data

Oct. 9, 1975 Japan .................... 50-138485[U]

[51] Int. Cl.$^2$ .................... H03D 7/16; H04B 1/28
[52] U.S. Cl. ........................ 325/460; 325/316; 325/432
[58] Field of Search ............... 325/315, 316, 431, 432, 325/435, 436, 345, 458, 460, 461, 462

[56] References Cited

U.S. PATENT DOCUMENTS

| | | | |
|---|---|---|---|
| 2,245,385 | 6/1941 | Carlson | 325/460 |
| 3,440,545 | 4/1969 | Boomgaard | 325/315 |
| 3,472,967 | 10/1969 | Wofford et al. | 325/316 |
| 3,665,507 | 5/1972 | Peil | 325/432 |

Primary Examiner—Robert L. Griffin
Assistant Examiner—Marc E. Bookbinder
Attorney, Agent, or Firm—Lewis H. Eslinger; Alvin Sinderbrand

[57] ABSTRACT

In a radio receiver having first and second mixers and in which, during short wave reception, an intermediate frequency signal is produced through the first and second mixers and, during medium wave reception, an intermediate frequency signal is produced through only the second mixer; the second mixer is formed of a pair of transistors having collectors connected to each other and emitters also connected to each other. By changing over switches, the base of one of the transistors is supplied with a received signal during short wave reception, and the base of the other transistor is supplied with a received signal during medium wave reception. As a result, suitable intermediate frequency signals can be selectively obtained at the collectors of the transistors.

7 Claims, 1 Drawing Figure

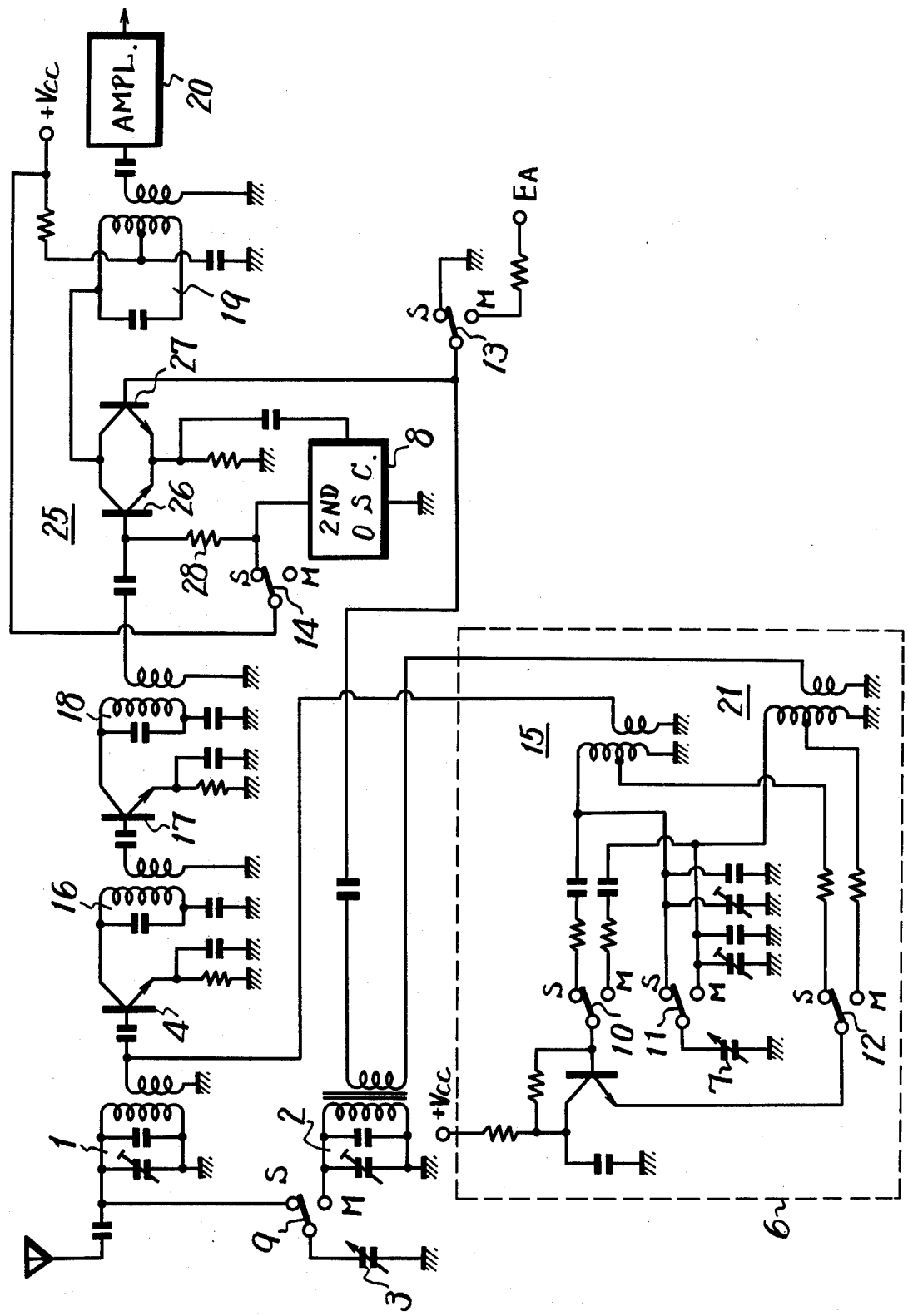

PLURAL BAND, SINGLE/DOUBLE CONVERSION RADIO RECEIVER

BACKGROUND OF THE INVENTION

1. Field of the Invention

This invention relates generally to a radio receiver, and more particularly to a radio receiver which operates as a double super upon reception of a short wave signal, and as a single super upon reception of a medium wave signal.

2. Description of the Prior Art

It is well known in the art to provide a radio receiver which can receive both short and medium wave signals. When a short wave signal is received, the prior art radio receiver converts the received short wave signal into an intermediate frequency signal of 10.7 MHz, and then further converts this intermediate frequency signal into a second intermediate frequency signal of 455 KHz, and thus is referred to as a double super. On the other hand, when a medium wave signal is received, such received signal is directly converted into an intermediate frequency signal of 455 KHz, and thus is commonly referred to as a single super. More particularly, in the prior art radio receiver, during short wave reception, an input high frequency signal is applied through a tuning circuit to the base of a transistor forming a first mixer. The base of this transistor is also supplied with a local oscillation signal from the transformer of a first oscillator. Thus, the transistor carries out a first stage of frequency conversion and produces a first intermediate frequency signal at its collector. When variable capacitors are adjusted to provide the first intermediate frequency signal with a frequency of, for example, 10.7 MHz, this first intermediate frequency signal is derived through a tuning circuit, amplified by, for example, a transistor, and then applied through a tuning circuit to, for example, the base of a transistor forming a second mixer. The base of the second mixer transistor is also supplied with a power source voltage $+V_{cc}$ which is also applied to a second local oscillator. Thus, the second local oscillator oscillates to produce a local oscillation signal which is applied to the emitter of the last mentioned or second mixer transistor so that the latter carries out a second frequency conversion and produces a second intermediate frequency signal at its collector. When the local oscillation frequency of the second local oscillator is adjusted to provide the second intermediate frequency signal with a frequency of, for example, 455 KHz, this signal is derived through a tuning circuit and an intermediate frequency signal amplifier. Thus, a desired short wave signal can be received.

During medium wave reception with the prior art radio receiver, a received high frequency signal is supplied through a tuning circuit provided only for medium wave reception to the base of the transistor forming the second mixer. The base of this second mixer transistor is also supplied with the local oscillation signal from the transformer of the first local oscillator and with an automatic gain control voltage $E_A$. However, the power source voltage $+V_{cc}$ is not applied to the second local oscillator during medium wave reception, and hence the second local oscillator does not oscillate. Accordingly, the received high frequency signal is converted by the second mixer transistor to an intermediate frequency signal with the local oscillation signal from the transformer of the first local oscillator. When the variable capacitor is adjusted to provide the converted or intermediate frequency signal with a frequency of, for example, 455 KHz, this signal is derived through the tuning circuit and intermediate frequency signal amplifier. Thus, a desired channel of medium waves or medium wave signal can be received.

In the above described prior art receiver, in order to select short wave or medium wave reception, a plurality of switches are changed-over preferably in ganged relation, so that such switches are desirably located close to each other. As a result, upon short wave reception, due to a stray capacity between switches of the first local oscillator and a switch connected to the base of the transistor forming the second mixer, the local oscillation signal from the first local oscillator is jumped in the base of the transistor forming the second mixer, or the local oscillation signal from the first local oscillator is induced in the bar-antenna tuning circuit for medium wave reception, and then jumped in the base of the second mixer transistor. By way of example, if it is assumed that the local oscillation frequency of the first local oscillator is $f_{OA}$, that the local oscillation frequency of the second local oscillator is $f_{OB}$, and the intermediate frequency from the second stage is $f_{IB}$ (for example, 455 KHz), as above, a self-spurious, whose frequency is $nf_{OA} \sim mf_{OB} = f_{IB}$ (in which $n$ and $m$ are positive integers), appears at the collector of the transistor forming the second mixer. This self-spurious is amplified by the intermediate frequency signal amplifier through its tuning circuit and mixed with the intermediate frequency signal of a desired channel. The foregoing results from the fact that the transistor forming the second mixer is used for both the short wave reception and the medium wave reception.

OBJECTS AND SUMMARY OF THE INVENTION

Accordingly, it is an object of the present invention to provide a novel radio receiver which overcomes the above described problem.

More particularly, it is an object of the invention to provide a radio receiver in which, during short wave reception, the output from a local oscillator is not erroneously applied to the mixer through a stray capacity produced between switches, whereby to avoid the production of self-spurious.

It is a further object of the invention to provide a radio receiver in which a resistor is inserted between the base of a transistor forming a mixer and the power supply line of a local oscillator to prevent unnecessary signals from being supplied to the mixer and to avoid the appearance of self-spurious by reason of such unnecessary signals.

It is still another object of the invention to provide a radio receiver, as aforesaid, which positively avoids the appearance of self-spurious by the addition of only the transistor or a resistor connected thereto.

According to an aspect of the present invention, in a radio receiver which comprises a first tuning circuit for tuning to a broadcasting wave of a first frequency band, a first mixer coupled to said first tuning circuit for converting said broadcasting wave into a first intermediate frequency signal with a local oscillation signal from a first local oscillator, a second tuning circuit for tuning to a broadcasting signal of a second frequency band, a second mixer coupled to said second tuning circuit for converting said second broadcasting wave into an intermediate frequency signal with the local oscillation signal from said first local oscillator, and also adapted to be coupled to said first mixer for converting said first intermediate frequency signal into a second intermediate frequency signal with a local oscillation signal from a second local oscillator; the second mixer consists of a pair of transistors whose common electrodes and output electrodes are respectively connected to each other, an input electrode of one of the transistors is coupled to said first mixer, an input electrode of the other transistor is coupled to said second tuning circuit, and switches are provided for selectively driving said transistors of the second mixer and thereby producing predetermined intermediate frequency signals at the respective output electrodes of said transistors.

The above, and other objects, features and advantages of the present invention, will become apparent from the following description taken in conjunction with the accompanying drawing.

BRIEF DESCRIPTION OF THE DRAWING

The single FIGURE of the drawing is a circuit diagram showing an embodiment of a radio receiver according to the present invention.

DESCRIPTION OF A PREFERRED EMBODIMENT

Referring to the drawing in detail, it will be seen that a radio receiver according to the invention includes an antenna tuning circuit 1 for short wave reception and a barantenna tuning circuit 2 for medium wave reception. A variable tuning capacitor 3 is provided in common for both tuning circuits 1 and 2. The radio receiver is further shown to comprise a first mixer formed of a transistor 4, a second mixer 25, a first local oscillator 6, a variable capacitor 7 for changing the local oscillation frequency of local oscillator 6, and a second local oscillator 8. In the illustrated embodiment, local oscillators 6 and 8 are formed so that their local oscillation frequencies can be changed separately and continuously, and the variable capacitors 3 and 7 are adjusted in ganged relation. Switches 9,10,11,12,13 and 14 are preferably in ganged relation and are provided with movable contacts which engage respective fixed contacts S upon short wave reception, and which are changed-over to engage respective fixed contacts M upon medium wave receiption. The switches 10,11 and 12 are included in the first local oscillator 6 to selectively provide a local oscillation signal from a transformer 15 or a local oscillation signal from a transformer 21.

In the radio receiver according to the invention, the second mixer 25 is formed of a pair of transistors 26 and 27 whose emitters are connected together to the output side of second local oscillator 8 and whose collectors are also connected together to a tuning circuit 19 which is, in turn, coupled to an intermediate frequency signal amplifier 20. The collector of transistor 4 forming the first mixer is connected through a tuning circuit 16, an amplifying transistor 17 and a tuning circuit 18 to the base of transistor 26. The contact S of switch 14 is connected to the power supply line of the second local oscillator 8 and to the base of the transistor 26 through a resistor 28. The movable contact of switch 13 is connected to the output side of bar-antenna tuning circuit 2 and also to the base of transistor 27. The contact S of switch 13 is grounded or floated in respect to potential.

Upon short wave reception, a received high frequency signal is supplied through tuning circuit 1 to the base of transistor 4 forming the first mixer, and the local oscillation signal obtained from transformer 15 of first local oscillator 6 is also supplied to the base of transistor 4. Thus, a first stage of frequency conversion is achieved by transistor 4 and hence a first intermediate frequency signal is produced at the collector of transistor 4. When variable capacitors 3 and 7 are adjusted to provide the first intermediate frequency signal with a frequency of, for example, 10.7 MHz, this signal is derived through tuning circuit 16, amplified by transistor 17, and then supplied through tuning circuit 18 to the base of transistor 26 of the second mixer 25. During short wave reception, the contact S of switch 14 is engaged so that the base of transistor 26 is supplied through resistor 28 with the power source voltage $+V_{cc}$ which is also applied to second local oscillator 8. Thus, local oscillator 8 oscillates and supplies a local oscillation signal to the emitter of transistor 26 which then achieves a second stage of frequency conversion and produces a second intermediate frequency signal at its collector. When the local oscillation frequency of second local oscillator 8 is selected so that, with the first intermediate frequency signal having a frequency of 10.7 MHz, the frequency of the second intermediate frequency signal is, for example, 455 KHz, such second intermediate frequency signal is derived through tuning circuit 19 and intermediate frequency signal amplifier 20. Thus, a desired short wave channel can be received. Since the base of transistor 27 is connected to ground through the contact S of switch 13, transistor 27 is in its off-state during the reception of short wave signals.

Upon medium wave reception, switches 9–14 are changed-over to engage their contacts M so that a received high frequency signal is applied through tuning circuit 2 to the base of transistor 27 of the second mixer 25, and the local oscillation signal from transformer 21 of first local oscillator 6 is applied to the base of transistor 27. Further, at this time, an automatic gain control voltage $E_A$ from an automatic gain control voltage source (not shown) is applied through switch 13 to the base of transistor 27. Since switch 14 engages its contact M, the power source voltage $+V_{cc}$ is not applied to second local oscillator 8 or to the base of transistor 26. Accordingly, transistor 26 is in its off-state, and second local oscillator 8 does not oscillate, so that the received high frequency signal is converted by transistor 27 with the local oscillation signal from first local oscillator 6 into an intermediate frequency signal of, for example, 455 KHz. This intermediate frequency signal is derived through tuning circuit 19 and amplifier 20. Thus, a desired medium wave channel can be received by adjustment of the variable capacitors 3 and 7.

It will be seen that, in the radio receiver according to this invention as described above, even if the switches 9–14 are located close to each other so as to be easily ganged and the local oscillation signal from first local oscillator 6 appears at switch 13 due to the stray capacity between switch 13 and the switches 10–12 in first local oscillator 6 during short wave reception, the off-state of transistor 27 ensures that a self-spurious whose frequency is expressed by $nf_{OA} \sim mf_{OB}=f_{IB}$ does not appear at the collectors of transistors 26 and 27. Further, since the output side of bar-antenna tuning circuit 2 for medium wave reception is not connected to the base of transistor 26, even if the local oscillation signal from first local oscillator 6 is induced in tuning circuit 2, this induced signal is not supplied to the base of transistor 26. As a result, no self-spurious appears at transistor 26. Due to the stray capacity between the switches 10–12 in first local oscillator 6 and switch 14, the local oscillation signal from first local oscillator 6 may appear at switch 14. However, resistor 28 is selected to have a sufficiently high resistance, for example, on the order of several ten kilo-ohms, and a by-pass capacitor of the power source line for supplying the power source voltage $+V_{cc}$ may be directly connected to switch 14, so that the local oscillation signal applied to switch 14 is not supplied to the base of transistor 26 to cause a self-spurious.

Thus, upon short wave reception with the radio receiver according to the present invention, there is no possibility that unnecessary signals due to self-spurious will be mixed into the final intermediate frequency signal. Moreover, the foregoing advantageous effect is achieved by using only one additional transistor in the second mixer 25.

It is also possible to use field effect transistors as the transistors forming the mixers 4 and 25 in place of the bi-polar transistors shown in the drawing.

Although an illustrative embodiment of the invention has been described in detail herein with reference to the accompanying drawing, it is to be understood that the invention is not limited to that precise embodiment, and that various changes and modifications may be effected therein by one skilled in the art without departing from the scope or spirit of the invention as defined in the appended claims.

What is claimed is:

1. A radio receiver for selectively receiving broadcast signals in first and second frequency bands, comprising:

first and second local oscillators for producing respective local oscillation signals;

a first tuning circuit for tuning to a broadcast signal in said first frequency band;

a first mixer coupled to said first tuning circuit for converting the broadcast signal of said first frequency band into a first intermediate frequency signal with a local oscillation signal from said first local oscillator;

a second tuning circuit for tuning to a broadcast signal in said second frequency band;

a second mixer consisting of first and second transistors each having input, output and common electrodes, said common electrodes of said first and second transistors being connected to each other, and said output electrodes of said first and second transistors being connected to each other;

means coupling the input electrode of said first transistor to said first mixer for converting said first intermediate frequency signal into a second intermediate frequency signal with a local oscillation signal from said second local oscillator;

means coupling the input electrode of said second transistor to said second tuning circuit and said first local oscillator for converting the broadcast signal of said second frequency band into an intermediate frequency signal by means of a local oscillation signal from said first local oscillator; and switching means for selectively enabling and disabling said first and second transistors and thereby providing a respective predetermined intermediate frequency signal at the output electrodes of said transistors corresponding to a broadcast signal selectively received in one of said frequency bands.

2. A radio receiver according to claim 1; further comprising an operating voltage source; and in which said switching means includes a first switch for applying an operating voltage from said source to said second local oscillator and to said input electrode of said first transistor during the reception of broadcast signals in said first frequency band.

3. A radio receiver according to claim 2; further comprising a resistor connected between said input electrode of the first transistor and said second local oscillator; and in which said first switch is connected to a connection point between said resistor and said second local oscillator.

4. A radio receiver according to claim 2; in which said switching means further includes a second switch for connecting said input electrode of the second transistor to ground during the reception of broadcast signals in said first frequency band.

5. A radio receiver according to claim 4; further comprising an automatic gain control voltage source; and in which said second switch is operative to apply an automatic gain control voltage from said source thereof to said input electrode of the second transistor during the reception of broadcast signals in said second frequency band.

6. A radio receiver according to claim 5; further comprising a resistor connected between said input electrode of the first transistor and said second local oscillator; and in which said first switch is connected to a connection point between said resistor and said second local oscillator.

7. A radio receiver according to claim 6; in which each of said first and second transistors is a bi-polar transistor having base, collector and emitter electrodes which constitute said input, output ad common electrodes, respectively.

* * * * *